United States Patent
Pope

(10) Patent No.: US 11,728,826 B2
(45) Date of Patent: Aug. 15, 2023

(54) COMPRESSION AND DECOMPRESSION IN HARDWARE FOR DATA PROCESSING

(71) Applicant: Google LLC, Mountain View, CA (US)

(72) Inventor: Reiner Alwyn Pope, Sunnyvale, CA (US)

(73) Assignee: Google LLC, Mountain View, CA (US)

( * ) Notice: Subject to any disclaimer, the term of this patent is extended or adjusted under 35 U.S.C. 154(b) by 78 days.

(21) Appl. No.: 17/328,452

(22) Filed: May 24, 2021

(65) Prior Publication Data

US 2022/0376703 A1    Nov. 24, 2022

(51) Int. Cl.
*H03M 7/00*     (2006.01)
*H03M 7/42*     (2006.01)
*H03M 7/30*     (2006.01)

(52) U.S. Cl.
CPC .............. *H03M 7/42* (2013.01); *H03M 7/005* (2013.01); *H03M 7/6011* (2013.01)

(58) Field of Classification Search
CPC ....... H03M 7/42; H03M 7/005; H03M 7/6011
USPC ...................................................... 341/50, 51
See application file for complete search history.

(56) References Cited

U.S. PATENT DOCUMENTS

| | | |
|---|---|---|
| 6,446,145 B1 | 9/2002 | Har et al. |
| 7,925,863 B2 | 4/2011 | Hundley |
| 8,918,579 B2 | 12/2014 | Kettner |
| 2003/0160984 A1 | 8/2003 | Clothier et al. |
| 2019/0034334 A1* | 1/2019 | Arelakis ................ H03M 7/40 |
| 2020/0143249 A1 | 5/2020 | Georgiadis |

FOREIGN PATENT DOCUMENTS

| | | |
|---|---|---|
| GB | 2286942 A | 8/1995 |
| GB | 2311705 A | 10/1997 |
| WO | 2021064013 A2 | 4/2021 |

OTHER PUBLICATIONS

Bypass Compression Option, [online] [retrieved Mar. 8, 2021]. Retrieved from the Internet: <URL: https://docs.bmc.com/docs/DataAccelerator16/bypass-compression-option-718784319.html>, 4 pages.

Cheng et al., "A Survey of Model Compression and Acceleration for Deep Neural Networks," IEEESignal Processing Magazine, Special Issue on Deep learning for Image Understanding, arXiv:1710.09282v9 [cs.LG] Jun. 14, 2020, 10 pages.

(Continued)

*Primary Examiner* — Jean B Jeanglaude
(74) *Attorney, Agent, or Firm* — Lerner David LLP

(57) ABSTRACT

Methods, systems, and apparatus, including computer-readable storage media for hardware compression and decompression. A system can include a decompressor device coupled to a memory device and a processor. The decompressor device can be configured to receive, from the memory device, compressed data that has been compressed using an entropy encoding, process the compressed data using the entropy encoding to generate uncompressed data, and send the uncompressed data to the processor. The system can also include a compressor device configured to generate, from uncompressed data, a probability distribution of codewords, generate a code table from the probability distribution, and compress incoming data using the generated code table.

18 Claims, 12 Drawing Sheets

(56) References Cited

OTHER PUBLICATIONS

Das et al,. "Performance and Power Optimization through Data Compression in Network-on-Chip Architectures," IEEE, 2008, 11 pages.
Giesen, "Interleaved entropy coders", arXiv:1402.3392v1 [cs.IT], Feb. 17, 2014, 16 pages.
Han et al., Deep Compression: Compressing Deep Neural Networks With Pruning, Trained Quantization and Huffman Coding, Published as a conference paper at ICLR 2016, arXiv:1510.00149v5 [cs.CV] Feb. 15, 2016, 14 pages.
Kim et al., Hardware-accelerated Fast Lossless Compression Based on LZ4 Algorithm, ICDSP 2019, Feb. 24-26, 2019, Jeju Island, Republic of Korea, 4 pages.
Langi, Armein Z.R., "A Hardware Architecture of a Counter-Based Entropy Coder,", ITB J. Eng. Sci., vol. 44, No. 1, 2012, 33-48, 15 pages.
Laude et al., "Neural Network Compression using Transform Coding and Clustering", arXiv:1805.07258v1 [cs.CV], May 18, 2018, 4 pages.
NVIDIA A100 Tensor Core GPU Architecture Unprecedented Acceleration at Every Scale, [online] [retrieved Mar. 8, 2021]. Retrieved from the Internet: <URL:<https://www.nvidia.com/content/dam/en-zz/Solutions/Data-Center/nvidia-ampere-architecture-whitepaper.pdf>, 2020 NVIDIA Corporation, p. 41 of 82 pages.
Oktay et al., "Scalable Model Compression by Entropy Penalized Reparameterization," Published as a conference paper at ICLR 2020, arXiv:1906.06624v3 [cs.LG] Feb. 16, 2020, 11 pages.
Park et al., "Weighted-Entropy-Based Quantization for Deep Neural Networks," Open Access version, provided by the Computer Vision Foundation identical to the version available on IEEE Xplore, 2017, pp. 5456-5464.
Pekhimenko et al., [online] [retrieved Mar. 8, 2021]. Retrieved from the Internet: <URL:<https://research.ece.cmu.edu/safari/thesis/gpekhimenko_dissertation.pdf>, CMU-CS-16-116 Jul. 2016, Chapter 6 "Toggle-Aware Bandwidth Compression", pp. 113-141 of 197 pages.
Wiedemann et al., "Entropy-Constrained Training of Deep Neural Networks," arXiv:1812.07520v2 [cs.LG], Dec. 19, 2018, 8 pages.
Wiedemann et al. Response to the Call for Proposals on Neural Network Compression: End-to-end processing pipeline for highly compressible neural networks. 126. MPEG Meeting; Mar. 25, 2019-Mar. 29, 2019; Geneva; (Motion Picture Expert Group or ISO/IEC JTC1/SC29/WG11), No. m47698 Mar. 28, 2019 (Mar. 28, 2019), 27 pages. Retrieved from the Internet: <http://phenix.int-evry.fr/mpeg/doc_end_user/documents/126_Geneva/wg11/m47698-v3-m4 7698-v3. zip m4 7698-v3/m4 7698 v3 .docx>.
Sun et al. A High-efficiency HEVC Entropy Decoding Hardware Architecture. 2015 17th International Conference On Advanced Communication Technology (ICACT), Global IT Research Institute (GIRI), Jul. 1, 2015 (Jul. 1, 2015), pp. 186-190.
Extended European Search Report for European Patent Application No. 22156410.7 dated Jul. 15, 2022. 14 pages.

\* cited by examiner

COMPRESSION AND DECOMPRESSION IN HARDWARE FOR DATA PROCESSING

BACKGROUND

Data compression refers to techniques for reducing the number of bits of input data while still preserving at least some of the same information represented by the input data. Compression can be lossless, in which no information is lost during compression, or lossy, in which some information is lost during compression. Data decompression refers to techniques for reversing data compression—receiving input compressed data and generating the data in its original uncompressed form. A data compression ratio for a compression technique is a measure of the relationship between the size of data before and after compression using a data compression technique. For example, data compression that compresses 10 megabytes to 2 megabytes has a compression ratio of $$\frac{10}{2} = 5.$$

Entropy encoding refers to a lossless data compression technique in which values, or "codewords," of a fixed length are replaced with shorter, symbols of varying length. The mapping between codewords and the symbols is determined based on a probability distribution of the rate of occurrence of the codewords, more frequently occurring codewords can be replaced with shorter symbols, and less frequently occurring codewords can be replaced with longer symbols.

Neural networks are machine learning models that include one or more layers of nonlinear operations to predict an output for a received input. In addition to an input layer and an output layer, some neural networks include one or more hidden layers. The output of each hidden layer can be input to another hidden layer or the output layer of the neural network. Each layer of the neural network can generate a respective output from a received input according to values for one or more model parameters for the layer. The model parameters can be weights or biases that are determined through a training algorithm to cause the neural network to generate accurate output.

BRIEF SUMMARY

Aspects of the disclosure are directed to techniques for hardware compression and decompression of data transferred between hardware processors and hardware memory devices of a processing system.

One aspect of the disclosure is directed to a system, the system including: one or more memory devices including a first memory device; one or more processors including a first processor, wherein the one or more processors are coupled to the one or more memory devices; and a decompressor device coupled at least to the first memory device and the first processor, wherein the decompressor device is configured to: receive, from the first memory device, compressed data that has been compressed using entropy encoding, process the compressed data using the entropy encoding to generate uncompressed data, and send the uncompressed data to the first processor.

Another aspect of the disclosure is directed to a decompressor device for data decompression, wherein the decompression device is configured to: receive, from a first memory device, compressed data, wherein the compressed data has been compressed using an entropy encoding; process the compressed data using the entropy encoding to generate uncompressed data; and send the uncompressed data to a first processor.

Another aspect of the disclosure is directed to a method for data decompression performed by a decompressor device, the method including: receiving, by the decompressor device and from a first memory device, compressed data. The compressed data can be been compressed using an entropy encoding; processing, by the decompressor device, the compressed data using the entropy encoding to generate uncompressed data; and sending, by the decompressor device, the uncompressed data to a first processor.

The compressed data can be first compressed data and the uncompressed data can be first uncompressed data, and the system can further include a compressor device coupled at least to the first memory device and the first processor, wherein the compressor device is configured to: receive second uncompressed data from the first processor; process the second uncompressed data using the entropy encoding to generate second compressed data; and send the second compressed data to the first memory device.

At least one of the compressor device and the decompressor device can be implemented as an integrated circuit coupled to the first memory device and the first processor by one or more circuit interconnects.

A code table corresponding to the entropy encoding can be stored on the first memory device, and at least one of the decompressor device and the compressor device can be configured to process data using the entropy encoding by accessing the code table from the first memory device.

The compressor device can be further configured to: receive third uncompressed data from the first memory device; generate, from the third uncompressed data, a probability distribution of codewords from the third uncompressed data; generate a code table from the probability distribution of the codewords; process the third uncompressed data using the generated code table to generate third compressed data; and send the third compressed data and the generated code table to the first memory device.

The decompressor device can be further configured to: receive, from the first memory device, the generated code table; and process the third compressed data using the entropy encoding and the code table.

The compressed data can be data compressed from input data, and the one or more processors can be configured to: process input data to generate a probability distribution of codewords from the input data; generate a code table from the probability distribution of the codewords in the input data; store the code table in the first memory device. The decompressor device can be configured to process the compressed data by accessing the code table stored in the first memory device.

The input data can include a plurality of model parameter values for a neural network including a plurality of layers. The one or more processors can be further configured to: generate, for each layer of the neural network, a respective probability distribution of codewords for respective model parameter values in the layer, and generate, for each layer of the neural network and from the respective probability distribution for the layer, a respective layer code table. The code table stored in the first memory device can include a plurality of layer code tables.

The decompressor device can be further configured to: identify first compressed model parameter values corresponding to a first layer of the plurality of layers, and process the first compressed model parameter values using the entropy encoding and a first layer code table corresponding to the first layer.

The plurality of model parameter values can each be represented in a floating point format including at least an exponent. The one or more processors can be further configured to: generate, for each layer of the neural network, the respective probability distribution of codewords using exponents of model parameter values in the layer as codewords.

The decompressor device can include a plurality of entropy coders configured to decompress data using the entropy encoding. The decompressor device can be further configured to: distribute the compressed data across each of the plurality of entropy coders; process the compressed data across each of the plurality of entropy coders to generate respective output decompressed data; and generate the decompressed data corresponding to the compressed data from the respective output decompressed data of each of the plurality of entropy coders.

The number of entropy coders that the decompressor device can include can depend at least on (i) the maximum bandwidth between the first memory device and the first processor, and (ii) the maximum bandwidth of each entropy coder.

The decompressor device can be further configured to process the compressed data using the entropy encoding by using a code table generated from a probability distribution of codewords identified in uncompressed input data.

The code table can include a plurality of layer code tables, each layer code table corresponding to codewords from a plurality of model parameter values of a respective layer of a neural network including a plurality of layers.

Other aspects of the disclosure include instructions stored on computer-readable storage media storing instructions that cause one or more processors to perform actions of the methods.

DETAILED DESCRIPTION

Figure 1:
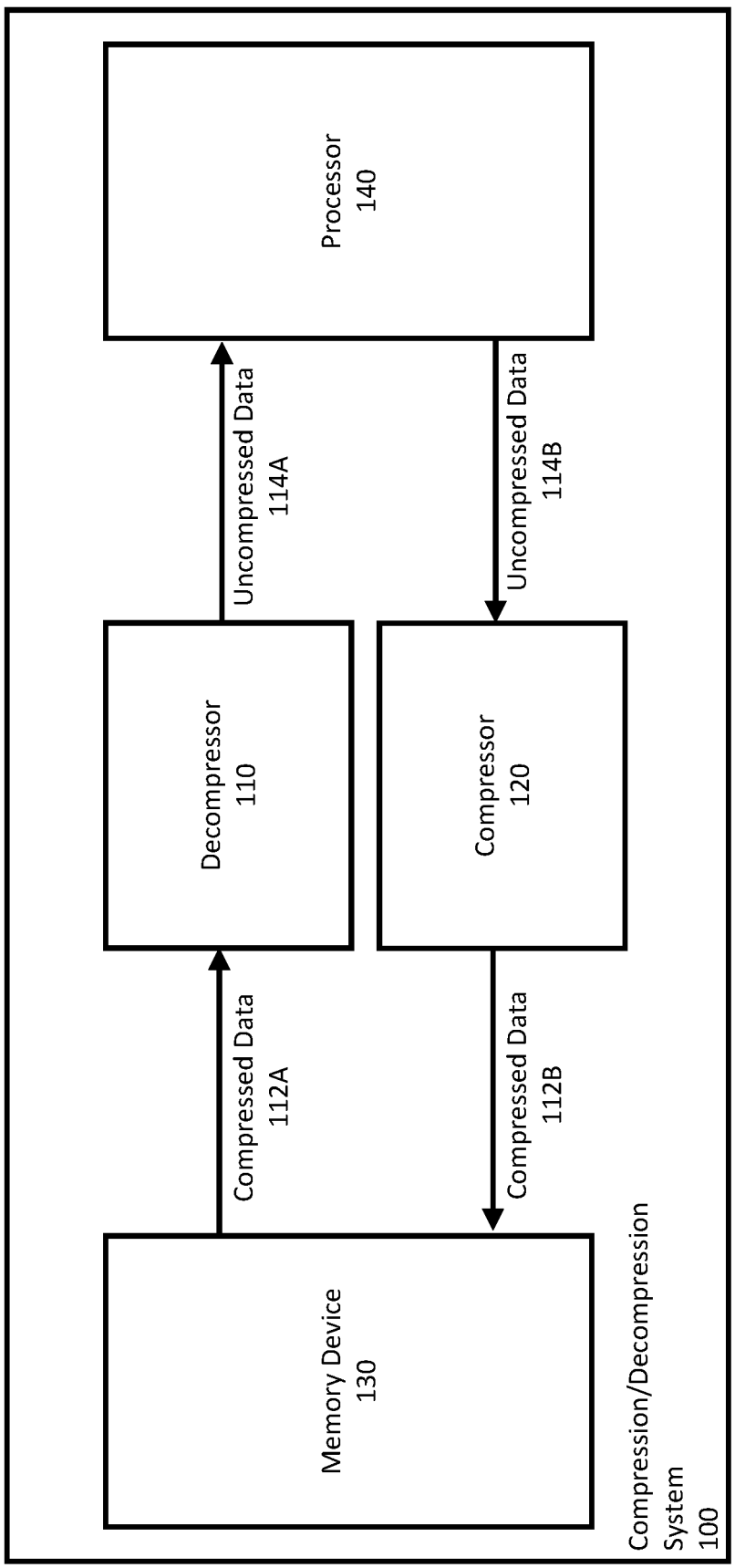
FIG. 1 is a block diagram of an example compression/decompression system including a decompressor device and a compressor device coupled to a memory device and a processor, according to aspects of the disclosure.

Overview:

Aspects of the disclosure are directed to techniques for data compression and decompression along circuit interconnects between processors and memory devices. A system including a processor and a memory device can compress and decompress data to improve the memory bandwidth of data communicated between the devices. The system can be implemented as part of an integrated circuit, such as a chip, which can be further implemented as part of a device, such as a server computing device configured for data processing. According to aspects of the disclosure, both data compression and decompression can be implemented in hardware as part of an integrated circuit.

Workloads like executing machine learning models often require executing operations on a device that includes both general-purpose processors, such as CPUs, and specialized hardware accelerators, such as GPUs or tensor processing units (TPUs). The memory bandwidth between processors and memory devices can become a computational bottleneck for executing a workload, particularly when executing the workload requires transferring data at a rate higher than the maximum available bandwidth between devices on an executing system.

Techniques for data compression and decompression often fall short of addressing the memory bandwidth bottleneck issue in executing workloads, at least because these techniques are often implemented in software and not in hardware. Further, other approaches assumed a minimum sparsity in the data representing machine learning models. Data sparsity can be measured as a proportion of zero to non-zero values among model parameter values representing a machine learning model, such as a neural network.

The system as described herein can be configured to generate an entropy encoding based on generating a probability distribution of codewords in input data to the system. An entropy encoding refers to a lossless data compression technique in which values, or "codewords," of a particular length are replaced with symbols that can vary in length. The length of the codewords can be, for example, an integer length of the number of bits to represent the codeword. As another example, the length of the codeword can be a non-integer value. The mapping between the compressible codewords in the data and the symbols can be determined based on a probability distribution of the rate of occurrence of the codewords. The mapping between codewords and symbols can be stored as an entropy code table. For example, codewords that statistically occur more often relative to other codewords can be mapped to shorter symbols, while codewords that statistically occur less often than other codewords can be mapped to longer symbols.

In some implementations, the system can compress data for dense neural networks, for example by compressing only exponents for model parameter values represented in a floating point format, instead of generating a code table over entire parameter values as codewords. In general, a floating point format can include a sign, an exponent, and a fraction or mantissa component. The system can reduce the time to train a complex deep neural network by compressing neural network data in real-time, as data is transferred to-and-from a memory device and a processor, such as a CPU or a TPU. The techniques described herein can be applied for a variety of different types of neural networks, each varying in their relative density/sparsity of data. In other words, the techniques herein can be applied without imposing a minimum data density/sparsity.

In addition or alternatively, a pre-processing engine can be configured to generate and compress data as one or more pre-processing operations. The compressed data can be stored in a memory device and decompressed by a decompressor device for the system, using the entropy encoding. As described herein, the system is configured to compress and decompress data corresponding to deep neural networks, by generating a corresponding entropy code table for model parameter values of each layer of a network.

In some implementations, the system is configured to differentiate between compressible and incompressible data, and cause incompressible data to bypass devices for compression and/or decompression. For example, the system can be configured to bypass a compression or decompression device for non-constant data, e.g. input data, in a workload, and pass compressed/decompressed constant data, such as model parameter values of a neural network, through the compression or decompression device.

In some implementations, the system is configured with only a decompressor device, configured to decompress data stored in a compressed format at a connected memory device. Compressed data can be copied and decompressed before being sent to a processor as part of executing a workload. At least for some workloads, such as executing a machine learning model at inference time, passing data only through a decompressor device can improve performance at least because data is stored in an already compressed format in memory. Storing data in a compressed format removes the computational expense associated with compressing the data through a corresponding compressor device during execution of the workload. In these implementations, compressible data for a machine learning model can be compressed and stored before the system begins receiving and processing input for the model.

Compressor and decompressor devices of the system described herein can parallelize compression and decompression operations through the use of multiple entropy coders. Entropy coders are circuits implemented as part of a compressor/decompressor device that are configured for receiving and processing a subset of incoming data, using the entropy encoding. An entropy coder can include a multiplier circuit and a look-up table for storing an entropy code table corresponding to an entropy encoding. The compressor and decompressor devices of the system can distribute incoming data to multiple entropy coders, process the data using the entropy encoding, and combine the individual outputs of the entropy coders to generate the final output corresponding to the incoming data.

Aspects of the disclosure can provide for a system that can more efficiently transfer data to and from processors and memory devices of a system executing a workload. The system can take arbitrarily different workloads and execute an entropy encoding in hardware. The rate of processing can be further improved by parallelizing the entropy encoding across multiple entropy coders, as described herein.

At inference, the system or a pre-processing engine can pre-process each layer of a trained neural network and store the compressed network in memory. Compressing the data allows more data to be stored in the memory device and to be transferred to a processor, effectively increasing the available bandwidth of a system. The system can decompress data right before passing the data to the processor for processing. In the case of dense neural networks that include constant data, such as model parameter values, the data can be stored in a compressed format and decompressed only as-needed for processing. As a result, a system can store more data with the same amount of physical memory, which can reduce the overall cost for producing the system, for example by requiring fewer memory devices on a chip. Further, by transferring data between devices in a compressed format, more data can be transferred in fewer processor cycles. This gain can also reduce the overall energy cost of the system executing a workload, for example a complex neural network with millions of parameter values.

Example Systems

FIG. 1 is a block diagram of an example compression/decompression system 100 including a decompressor device 120 and a compressor device 120 coupled to a memory device 130 and a processor 140, according to aspects of the disclosure.

The system 100 can be a system implemented by any combination of hardware, software, and/or firmware. For example, the system 100 can be at least part of a system-on-a-chip implementing a number of components and integrated circuits on a circuit board or other material. The system 100 can be installed as part of a computing device and be configured to interact with other hardware components of the device, including memory, processors, network components, and/or peripherals. The memory device 130 and the processor 140 can be integrated to a board implementing components of the system 100. In other examples, the memory device 130 and/or processor 140 can be coupled to the system 100 through some physical interface, such as a slot or socket.

As described herein, the decompressor device 120 and the compressor device 120 can be implemented as a set of integrated circuits connected to the processor 140 and memory device 130, for example through one or more buses or one or more circuit interconnects. The system 100 can communicate data to and from the memory device 130 and the processor 140, through the decompressor device 120 and the compressor device 120. The memory device 130 can store compressed data. The compressed data can be data that has been compressed previously by the compressor device 120. As another example, the compressed data can be data that has been compressed by a pre-processing engine, as described in more detail with reference to FIG. 3.

The memory device 130 can be any of a variety of different types of memory, including RAM, DRAM, high-bandwidth memory (HBM), and/or a cache such as L1 or L2 built from SRAM. The processor 140 can be any of a variety of different types of processors, for example a central processing unit (CPU), a graphics processing unit (GPU), a field-programmable gate array (FPGA), or an application-specific integrated circuit (ASIC), such as a tensor processing unit (TPU).

The memory device 130 sends data for processing by the processor 140 as compressed data 112A to the decompressor device 120. The data sent by the memory device 130 can be data for processing any of a variety of different workloads.

A workload refers to some task performed by the system 100 on some data. For example, the workload that the system 100 is configured to perform can be to train or execute a neural network. The data sent by the memory device 130 can be, for example, data defining the neural network, such as model parameter values representing weights and/or bias values for each of multiple layers of the network. The data can also include inputs to the neural network itself that are processed with the model parameter values to generate some network output.

The data can be stored and sent by the memory device 130 according to a variety of different formats. In examples in which the workload for the system 100 is to execute or train a neural network, data can be stored and sent as tensors. A tensor is a multi-dimensional array. For example, a zero-dimensional tensor is a scalar value, a one-dimensional tensor is a vector, and a two-dimensional tensor is a matrix. Elements of a tensor can be, for example values for different model parameters for a given layer of a neural network, or input or output between layers of a neural network or of the neural network itself. Elements for a tensor, or the data in general, can be in one or more of a variety of different formats, including floating point formats, such as 8, 16, 32, or 64-bit floats, and fixed-precision formats, such as 4, 8, 16, 32, and 64-bit integers. While tensors are provided as one example of a format in which data is transferred, in general any of a variety of different data structures, formats, or representations of data, can be used.

The decompressor device 120 receives and processes the compressed data 112A to generate uncompressed data 114A. The processor 140 receives the uncompressed data 114A and performs one or more operations on the data. For example, the processor 140 can be configured for performing logical or arithmetic operations on the uncompressed data 114A, and generate output uncompressed data 114B. The uncompressed data 114B can be sent to the compressor device 120, which is configured to compress the data to generate compressed data 112B. The memory device 130 can receive and store the compressed data 112B, which in turn can be sent back for subsequent processing by way of the decompressor device 120.

The compressor device 120 and decompressor device 120 can implement any of a variety of different techniques for compression/decompression. For example and as described in more detail with respect to FIGS. 6-9, the compressor device 120 and decompressor device 120 can be configured to perform an entropy encoding to compress incoming data from the memory device 130. In some implementations, as described herein with reference to FIG. 4, the compressor device 120 and/or decompressor device 120 can implement multiple entropy coders for parallel execution of an entropy encoding for input data.

Examples of entropy encodings that can be used include Huffman codes and arithmetic codes and asymmetric numeral systems (ANS), although any of a variety of different entropy encoding techniques can be applied. Also as described herein, the system 100 can take advantage of the distribution of repeated values in neural network data executed as part of a workload. In particular, the system 100 can be configured to generate entropy encodings based on the probability distribution of exponents in model parameter values of a neural network received for processing, and can further generate code tables for compressing incoming neural network data on a per-layer basis.

Storing and compressing data can improve operation of the system 100, at least because more information can be transferred to the processor 140 without changing any underlying memory technology. For many workloads, such as executing a neural network, the computational bottleneck is not at the processor or memory device, but in the memory bandwidth between processor and memory. Compressing data in hardware, for example as shown in FIG. 1, allows more data to be transferred between memory device and processor. For example, if the compressor device 120 compresses data with a compression ratio of 1.5, then memory bandwidth saturated at 100 gigabytes/second can transfer up to 150 gigabytes per second of data, by first compressing the data. Storing data in a compressed format in the memory device 130 can also improve the total storage capacity of the memory device 130.

Figure 2:
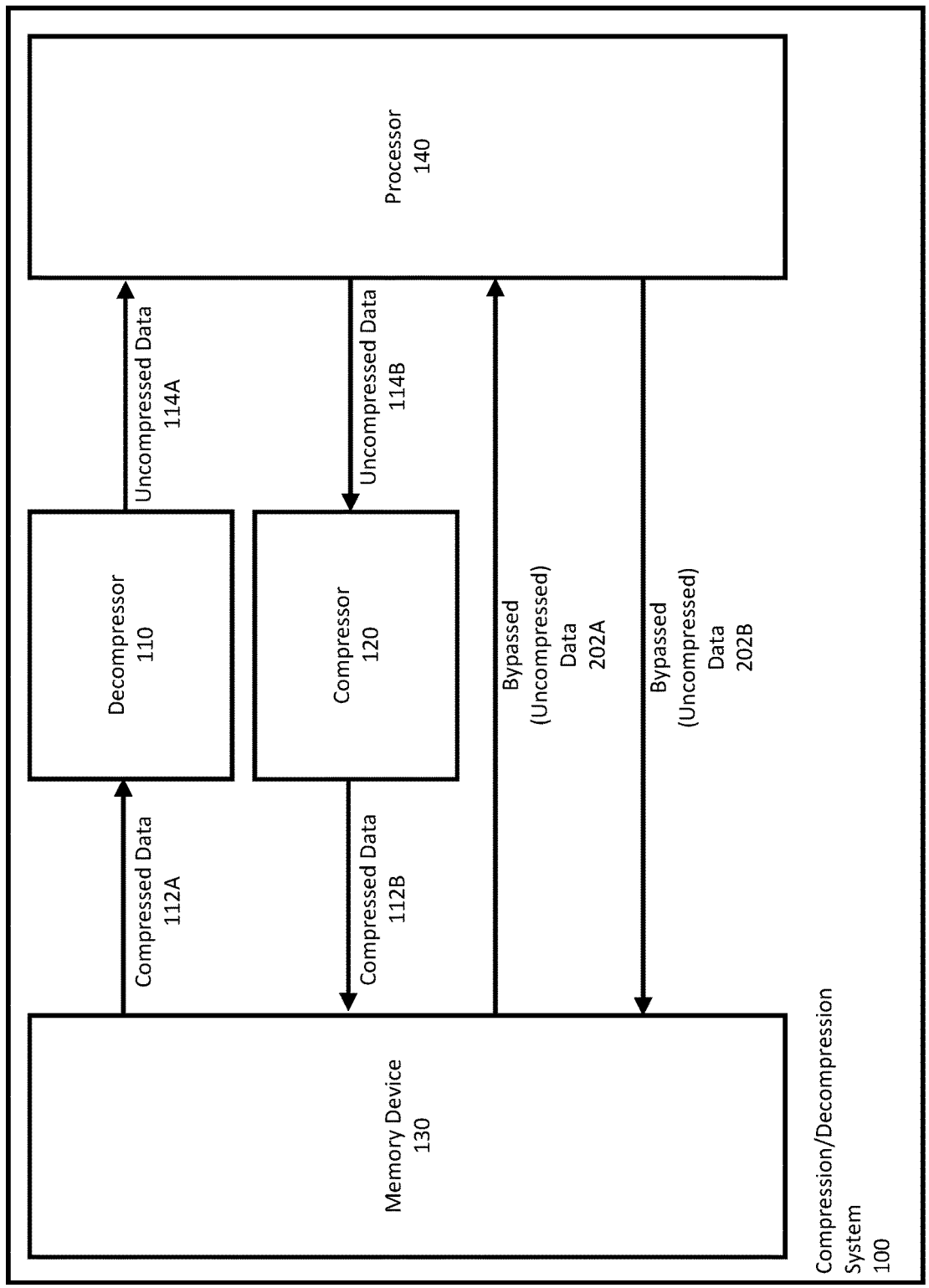
FIG. 2 is a block diagram of the example system including a bypass for uncompressed data between the memory device and the processor.

FIG. 2 is a block diagram of the example system 100 including a bypass for uncompressed data 202A, B between the memory device 130 and the processor 140. The memory device 130 can store both compressed and uncompressed data. Uncompressed data in some cases may be incompressible, meaning the compression ratio between data of this type and a compressed format is 1 or close to 1 within a predetermined threshold. The threshold can be determined, for example, based on trade-offs between the computational resources expended to compress data of this type, and the increase in performance as a result of transferring the data in a compressed format, as described herein with the compressed data 112A, B. Computational resources expended can be measured, for example, based on the latency added to transmission between the memory device 130 and the processor 140, and/or the number of processing cycles required to perform the compression/decompression versus the amount of data compressed.

To determine whether incoming data is compressible or incompressible, the system 100 can in some examples be configured to identify the source location in memory of incoming data, and determine whether the data is compressible or incompressible based on the source location. For example, at least a portion of memory identified by an address range can be reserved for incompressible data, and the rest of the memory can be reserved for compressible data. Data can be pre-processed, for example by a pre-processing engine 301 as described herein, to be stored in memory within the correct ranges corresponding to whether the data is compressible or incompressible.

In some examples, the system 100 can be configured to perform certain operations in response to different instructions specifying whether incoming data for processing should be compressed or not. For example, the system 100 can receive instructions for transferring only some data between the memory device 130 and the processor 140 through the decompressor 110 and/or the compressor 120, and be configured to directly transfer other data to and from the memory device 130 and processor 140 otherwise. In other examples, the default of the system 100 may be to bypass data if not accompanied with specific instructions to transfer with compression.

The incoming data stored on the memory device 130 can be sorted into compressible and incompressible data according to any criteria, which can vary from implementation-to-implementation. In some examples, the data can be sorted based on its type, e.g., only data in floating-point format is subject to compression, while integer valued data is bypassed.

The system 100 can be configured to bypass the decompressor device 120 and compressor device 120, and send uncompressed data 202A directly to the processor 140. The processor 140 can receive and process the data 202A, and send uncompressed data 202B back to the memory device 130, which can be for example output to some computation performed. As examples, the bypass can be implemented as a bus or one or more circuit interconnects between the memory device 130 and the processor 140.

Figure 3:
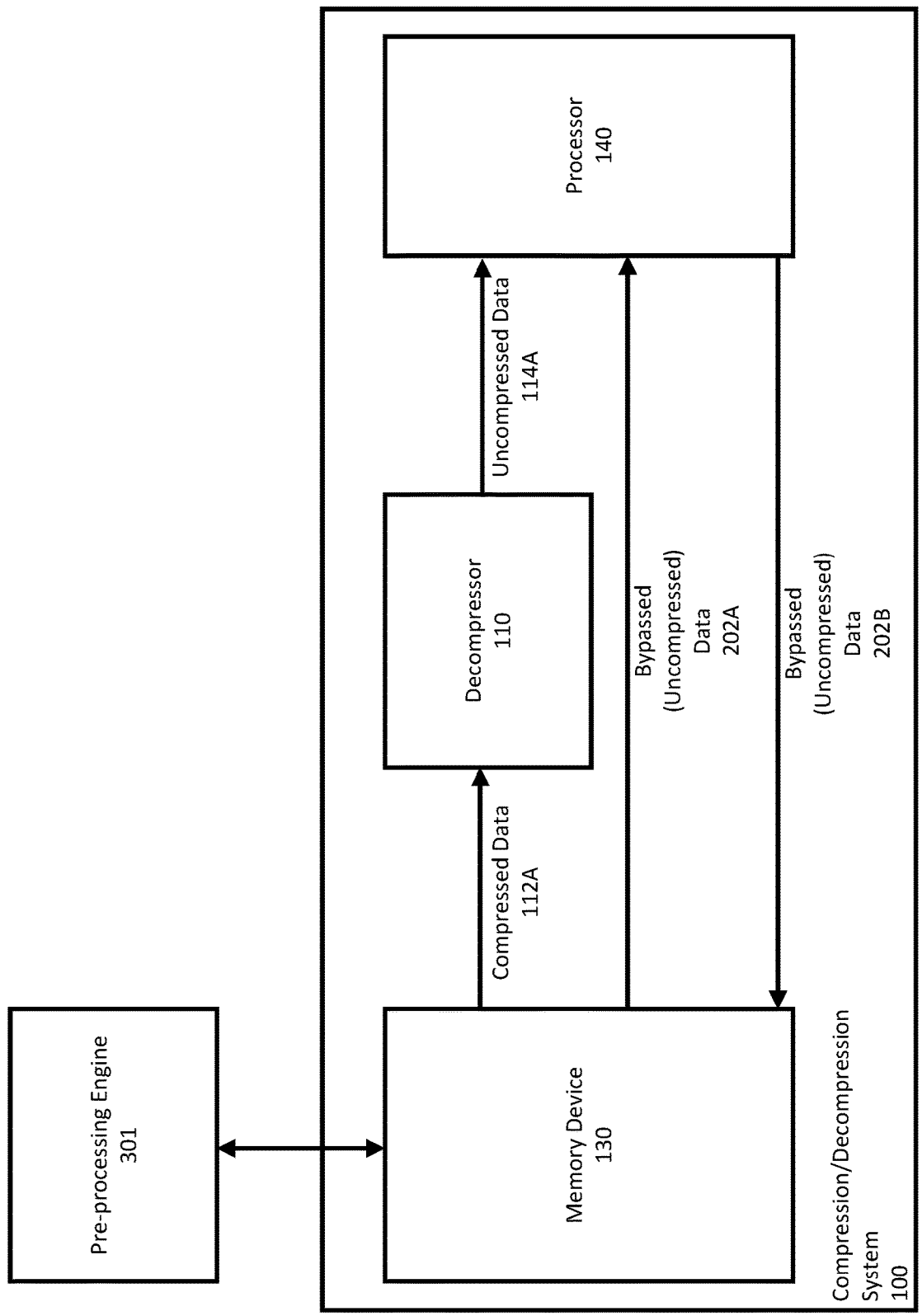
FIG. 3 is a block diagram of the example system including a decompressor device, but not a compressor device, according to aspects of the disclosure.

FIG. 3 is a block diagram of the example system 100 including the decompressor device 120, but not a compressor device, according to aspects of the disclosure. FIG. 3 shows an alternative implementation in which the system 100 is missing a compressor device, or has a device implemented but not active.

For some workloads, data can be compressed ahead of time by a pre-processing engine 301. The pre-processing engine 301 can be implemented according to any combination of software, firmware, and/or hardware, and can be executed by one or more processors in one or more locations, which can be the same or different locations as the system 100. For example, the pre-processing engine 301 can be implemented by a computing device in which the system 100 is installed. The pre-processing engine 301 can be configured to compress constant data in a workload, such as data that is not expected or will not change in value during execution of the workload.

An example workload that can be pre-compressed and stored are model parameter values of a trained neural network. Once a neural network is trained, generally the model parameter values are constant for the execution of the neural network on some input at inference time. The memory device 130 can store compressed model parameter values, which for example can be compressed from the pre-processing engine 301. During execution of the neural network, the memory device 130 can pass the compressed data 112A to the decompressor device 120, and as an example the compressed data 112A can be compressed model parameter values that the processor 140 will use as input for performing some operation related to the neural network.

The processor 140 can also receive the uncompressed data 202A stored in the memory device 130, which for example can be input to the neural network. The processor 140 performs one or more operations related to executing the neural network, for example matrix multiplication or computing the output to an activation function, and returns the uncompressed data 202B to the memory device 130. The uncompressed data 202B can be, for example, output of the one or more operations performed by the neural network.

The memory device 130 can store copies of the compressed data 112A in memory even after passing the data 112A to the decompressor device 120. The uncompressed data 114A can be sent to the processor 140 and discarded after the applicable operations involving the uncompressed data 114A are performed. For workloads where the same data is repeatedly re-used, the data can be retrieved again in compressed form, rather than compressing and saving the data in the memory device 130 for later re-use.

For some workloads, the system 100 can be configured to use the compressor device 120 instead of receiving compressed data ahead of time, for example through the pre-processing engine 301. As an example, instead of executing a trained neural network as described herein with reference to FIG. 3, the system 100 can be tasked to execute instructions for training a neural network. In this example workload, there are fewer instances of constant re-usable data, at least because model parameter values for a neural network are generally changing through updates in training. The system 100 can be configured to compress data from the memory device 130 in real-time, through the use of the compressor device 120 implemented in hardware. The examples of executing versus training a neural network show that the configuration of the system 100 can vary from implementation-to-implementation in response to the type of workload being executed.

Even if only some, but not all, data is compressed in-transit between the memory device 130 and the processor 140, overall performance of the system 100 can increase at least for the portion of the data that is compressed. Additionally, for at least some workloads, such as executing dense neural networks with thousands of trained model parameter values, the proportion of compressible to incompressible data is large.

Figure 4A:
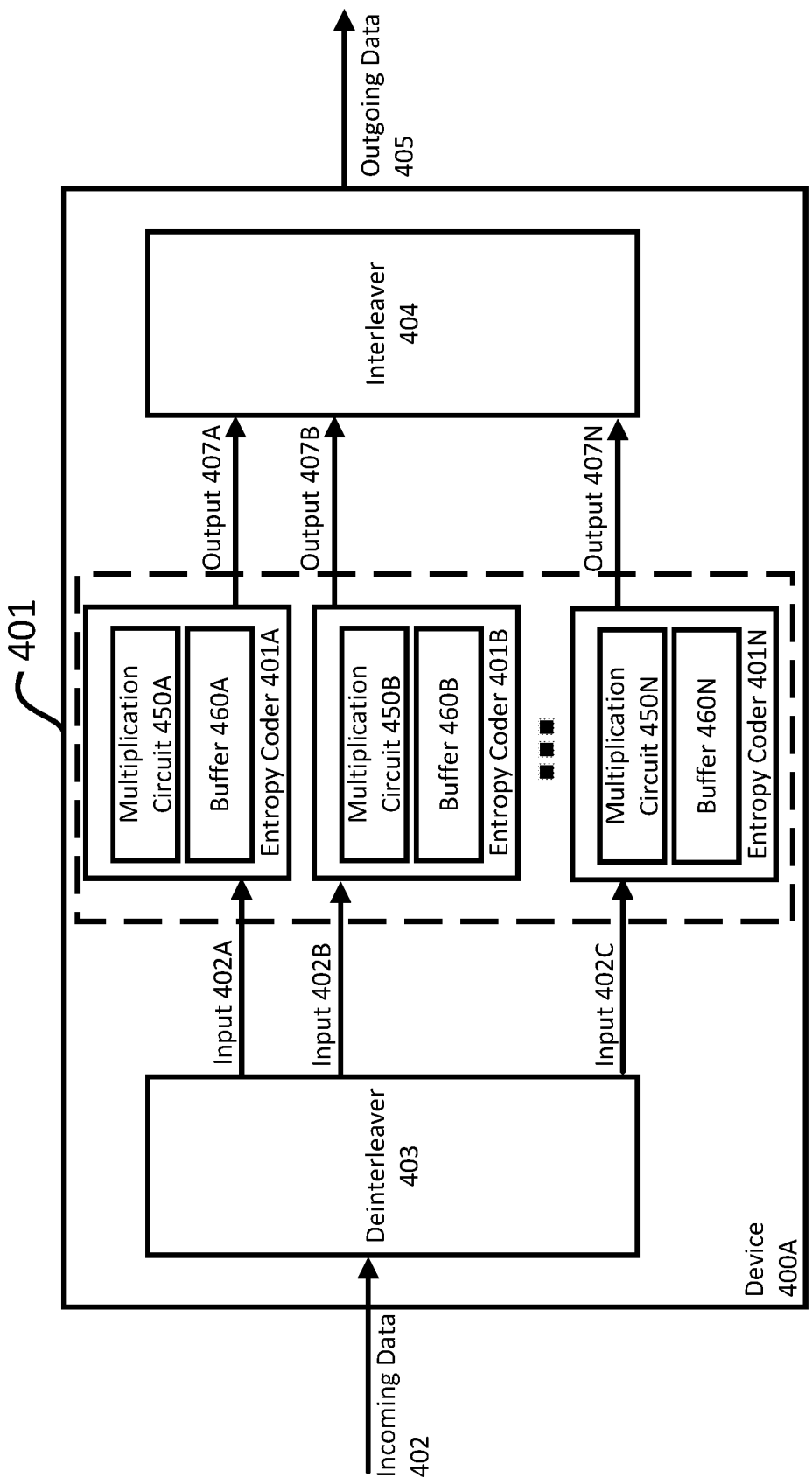
FIG. 4A is a block diagram of an example device implementing multiple entropy coders, according to aspects of the disclosure.

FIG. 4A is a block diagram of an example device 400A implementing multiple entropy coders 401, according to aspects of the disclosure. For example, the example device 400 can be a compressor device or a decompressor device. An entropy coder is a circuit configured to decompress or compress received data using an entropy encoding. In some examples, the entropy encoder can include a multiplier and a look-up table or some other structure for storing an entropy code table from which the entropy coders 401 compresses or decompresses incoming input data. The system 100 can be configured to load the entropy coders with a code table corresponding to the entropy encoding.

The implementation of the entropy coders 401 can depend at least in part of the technique for entropy coding implemented. For example, some types of encoding schemes, such as Huffman encoding, involve bit concatenation. The code table in these types of encoding schemes can be implemented as look-up tables mapping fixed-sized integer length codewords to symbols of variable lengths. After a stream of data is encoded or decoded (depending on whether the device 400A is a compressor or a decompressor device), the device 400A can be configured to concatenate the symbols to generate an output stream. An example hardware configuration is described herein with reference to FIG. 4B.

Each entropy coder 401A-N can include a respective multiplication circuit 450A-N. A multiplication circuit in an entropy coder can be implemented as one or more circuits for adding non-integer length codewords or symbols to a stream of data including output data 407A-N, as described herein with reference to FIG. 4B.

Each entropy coder 401A-N can include a respective buffer 460A-N. The buffer can be any type of memory implemented as part of hardware implementing an entropy coder. The buffer is configured to store incoming input data to a respective entropy coder, which can be provided by the device in response to a request from the respective entropy coder, as described herein with reference to FIG. 4B. As also described herein with reference to FIG. 4B, the size of the buffer, e.g., how much data the buffer can store, can vary according to different implementations.

The entropy coders 401, in some examples, can be implemented to encode or decode fixed-sized codewords to non-integer-sized symbols of variable length. An example scheme that uses non-integer-sized symbols can include asymmetric numeral system (ANS)-based schemes. If the entropy coders 401 are configured to encode or decode according to one of these types of entropy encoding schemes, then the device or pre-processing engine can be configured to generate look-up tables mapping fixed-sized codewords to pairs of (symbol, symbol_multiplier).

The symbol in the pair represents a symbol mapping to a fixed-length codeword. The symbol_multiplier is a value unique to a symbol and modifies how symbols are concatenated in the final output stream.

Symbols a and b in an output stream can be concatenated according to: (a<<symbol_multiplier)+b). Symbol_multiplier represents the shift distance of bits in a stream to accommodate the bit-width of the next symbol, in this case symbol b. When the symbols are integer-length, symbol_multiplier is a power of 2, equal to (1<<bit_width), where bit_width is the number of bits of a symbol. If the symbol length is not an integer, then the symbol_multiplier is a value corresponding to that length. As the lengths of symbols can vary from symbol-to-symbol, the corresponding symbol_multiplier can vary, and is stored as part of a pair with the symbol to be referenced by the device when encoding incoming data.

For example, to update the state of a current stream of data with concatenated symbols, the device 400A, e.g., as a compressor device with one or more entropy coders, can apply: (state=state*symbol_multiplier+symbol) for the next symbol to be concatenated.

Because codewords are the same length, a look-up table can include a codeword_multiplier representing the shift value for a non-integer-length codeword. The device can access the codeword_multiplier when concatenating codewords for a decoded output stream, as described herein with reference to FIG. 4B. The device 400A can in some examples decompress an incoming stream of compressed data by computing the inverse of compression, as described above. For example, the device 400A, e.g., as a decompressor device, can update the state of a current stream of data with concatenated codewords by applying: (state=(state−symbol)/codeword_multiplier).

The device 400A can perform the compression and decompression as described above using each of the implemented entropy coders 401A-D. As described herein with reference to FIGS. 4A-B, the device 400A can be configured for splitting and rejoining a stream of input data for compression/decompression, to each of the entropy coders.

Entropy coders 401A, B, and N are shown in FIG. 4A, but the entropy coders 401 can include more or fewer coders from implementation-to-implementation. As described in more detail with reference to FIGS. 5-7, the compressor device 120 can be configured to generate an entropy code table corresponding to a probability distribution of codewords in data processed by the system 100 as part of a workload. In the case of a neural network, the compressor device 120 can determine a probability distribution for model parameter values across each layer of the network, and generate and store a code table of symbols.

The device 400 can receive incoming input data 402 through a deinterleaver 403. The incoming input data 402 can be compressed or uncompressed data, depending on whether the device 400 is configured for decompressing or compressing incoming data, respectively. The deinterleaver 403 can be one or more circuits configured for receiving the incoming input data 402 and distributing the incoming input data 402 across the entropy coders 401. The entropy coders 401 process the individual inputs received from the deinterleaver 403, and generate individual outputs representing the compressed or decompressed version of the individual inputs, depending on the configuration of the device 400. An interleaver 404 receives the individual outputs. The interleaver 404 can be configured to combine the individual outputs 407A-N and pass the combined output as outgoing data 405. The outgoing data 405 can be passed to, for example, a memory device or a processor, depending on whether the device 400 is a compressor device or a decompressor device.

The number of entropy coders 401A can be based on the memory bandwidth for the system 100. For example, if the memory bandwidth between a processor and a memory device is 100 gigabytes/second, and the individual bandwidth of an entropy coder is 1 gigabyte/second at a 1 gigahertz clock frequency, then the device 400 can be implemented with 100 entropy coders, and be further configured to deinterleave or interleave input and output to and from the 100 coders. For some compression techniques, for example some entropy encodings in which processing is inherently sequential, running multiple instances of the entropy encoding through multiple entropy coders can improve the rate at which the device 400 processes the incoming input data 402.

Figure 4B:
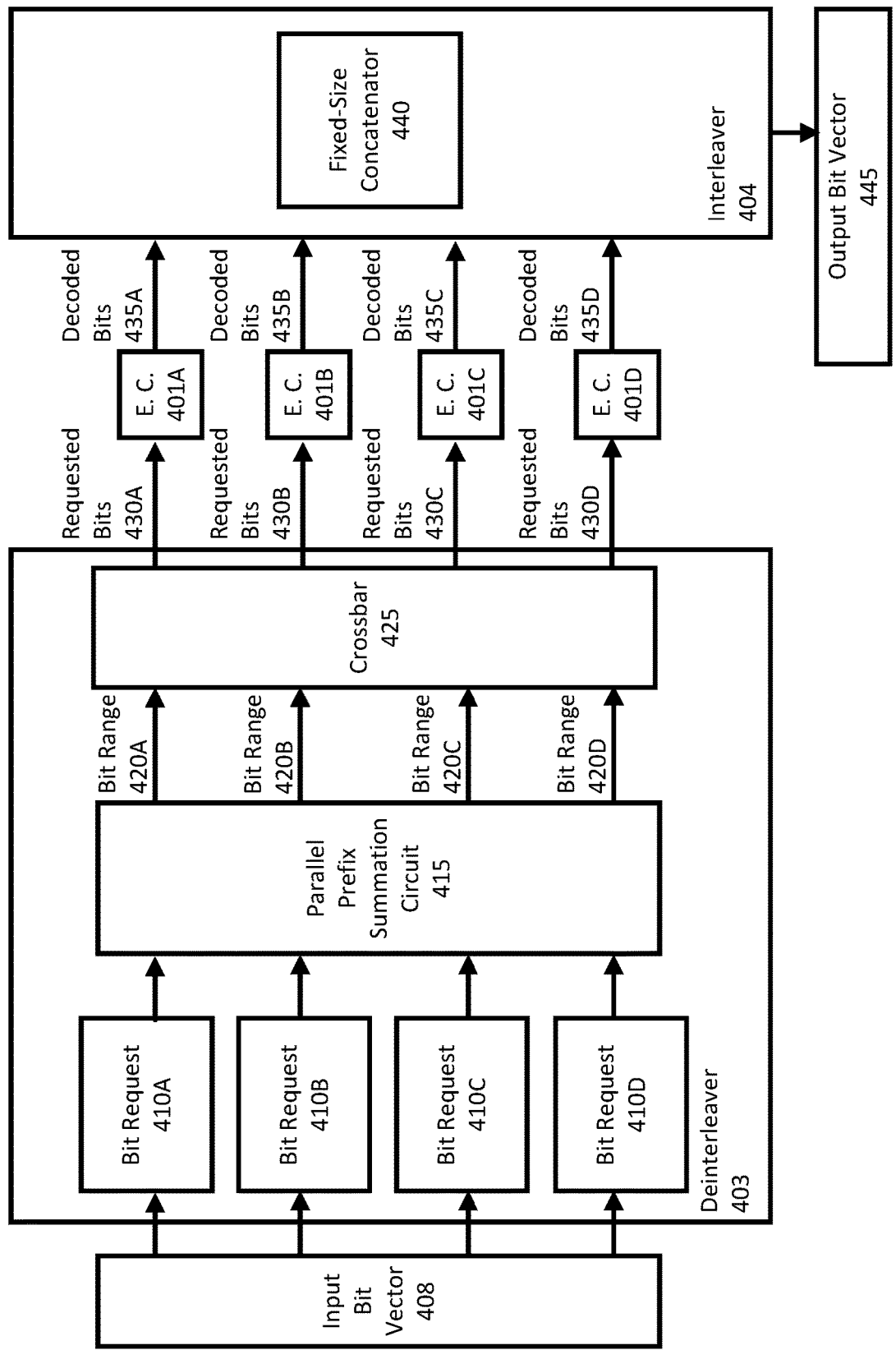
FIG. 4B is a block diagram of the example deinterleaver and the interleaver, according to aspects of the disclosure.

FIG. 4B is a block diagram 400B of the example deinterleaver 403 and the interleaver 404, according to aspects of the disclosure. In block diagram 400B, the device (not shown) implementing the deinterleaver 403 and the interleaver 404 is a decompressor device. The deinterleaver 403 receives a stream of incoming data as an input bit vector 408. The deinterleaver 403 passes bit requests 410A-D through a parallel prefix summation circuit 415. The deinterleaver 403 receives bit requests from each entropy coder 401A-D implemented in the example device. The bit requests 410A-D represent the amount of data each entropy coder needs to process incoming data at their individual bandwidth. For example, bit request 410A can be 3 bits, bit request 410B can be 7 bits, bit request 410C can be 0 bits, and bit request 410D can be 5 bits. The requests 3, 7, 0, and 5 can correspond to requests received from entropy encoders 401A-D, respectively.

The entropy coders 401A-D can be configured to send bit requests to the deinterleaver 403 periodically, e.g., every clock cycle. The entropy coders 401A-D can be configured to send bit requests to the deinterleaver 403 periodically, e.g., every clock cycle or after a predetermined number of clock cycles. Entropy coders can benefit from having to maintain a relatively small buffer, e.g. enough to store a few bits at a time, at least because bit requests can be made more frequently, reducing idle time caused in part by empty buffers.

As another example, the entropy coders 401A-D can be configured to batch bit requests into respective buffers, and process incoming input in batches. An entropy coder can be configured to request bits after a number of clock cycles, e.g., four clock cycles, instead of after every cycle. Requests that are made can be for more data at once, reducing the amount of processing required by the deinterleaver or interleaver in response to the received request. In these examples, the buffer for the entropy coder can be larger, for example relative to implementations in which bit requests are sent every cycle, to accommodate more data at once. Different implementations can include balancing bit request frequency with buffer size, depending for example on the nature of the data being processed, or hardware limitations on how large buffers can be for each entropy coder.

For example, the buffer size can be selected based on a desired trade-off between compression ratio and hardware throughput, which can vary depending on the use case or hardware constraints. For larger buffers, the probability of a stream of data to the device ending with data still in the buffer grows larger. In addition, if entropy coders are configured to make larger requests over multiple cycles instead of smaller requests per individual cycle, the chance of data remaining in the buffer when a stream ends also increases. Data unprocessed in the buffer is not added to an output stream, and can impact the overall compression ratio of the input and output data streams. For applications in which the compression ratio is required to be within a specific range, this trade-off may not be worth the increased hardware throughput afforded by the larger buffers. However, if throughput is a higher concern than maintaining a strict compression ratio, the entropy coders can be implemented with smaller buffers as described herein. Aspects of the disclosure can be implemented according to either approach, as well as according to a combination of the approaches described herein, e.g., to provide for increased throughput and a greater compression ratio.

In addition to handling bit requests from individual entropy coders, the deinterleaver 403 is configured to handle dependencies between the bit requests 410A-D from the entropy coders 401A-D. Bit requests from a first entropy coder can delay data in response to bit requests for data at a later location of the input bit vector 408, made by a second entropy coder. For example, if entropy encoder i needs more bits, then all entropy coders j>i will receive bits from a correspondingly later location in the input bit vector 408, forming a long dependence chain running through all of the bit requests to the deinterleaver 403. For example, with 100-1000 bit requests at any given point, the bit location for an entropy coder j is equal to the sum bit_request[0]+bit_request[1]+ . . . +bit_request[j−1], where bit_request[i] is the range of bits requested by an entropy coder i. The parallel prefix summation circuit 415 is configured to receive the bit requests 410A-D and to generate corresponding bit ranges 420A-D. The bit ranges 420A-D represent ranges in the input bit vector 408 of bits that meet each request 410A-D. For example, beginning from first element in the bit vector 408, the circuit 415 can add 3 (the first bit request 410A) and designate the elements of the bit vector 408 from 0-3 as the bits to meet the first bit request 410A for the entropy coder 401A. The circuit 415 can continue summing the bit requests 410B-D to generate the remaining bit ranges 420B-D. For example, bit range 420B can be elements 3 through 10 (inclusive) of the input bit vector 408, bit range 420C can be elements 10 through 10 (i.e., no bits because bit request 410C was 0), and bit range 420D can be 10 through 15 of the input vector 408.

The parallel prefix summation circuit 415 can be configured to compute N terms of a dependence chain to quickly identify bits in response to a request. For example, in the above example of responding to a bit request by entropy coder j, the parallel prefix summation circuit is configured to compute the sums for each of bit_request[0] through bit_request[j−1] in parallel, for example with log(N) delay, where N is the number of terms to sum to determine the location in the input bit vector 408 of the requested bits. Implementation of the parallel prefix summation circuit 415 as described herein allows for the distribution of entropy coding across many coders, while reducing the need for large buffers to store data from multiple requests at once, and also while keeping latency in processing data by the deinterleaver 403 low.

A crossbar 425 can be configured to receive the bit ranges 420A-D, and to route the requested bits 430A-D corresponding to the ranges, to the requesting entropy coder. A crossbar can be one or more circuits configured to route incoming data from different sources to a corresponding destination. For example, the crossbar can route 3 bits from the bit range 420A to the entropy coder 401A, 7 bits from the bit range 420B to the entropy coder 401B, 0 bits from the bit range 420C to the entropy coder 401C, and 5 bits from the bit range 420D to the entropy coder 401D.

The entropy coders 401A-D can process data, including the requested bits 430A-D, to generate decoded bits 435A-D. The interleaver 404 can receive the decoded bits 435A-D. The interleaver 404 can include a fixed-size concatenator 440 that can be implemented as one or more circuits configured to receive the decoded bits 435A-D, and concatenate the bits to generate an output bit vector 445. Decoded bits can correspond to integer-length codewords, which the concatenator 440 can be configured to concatenate by bit concatenation or shifting. In some examples, the concatenator 440 can be configured to apply a codeword multiplier and/or a symbol multiplier from a look-up table corresponding to the entropy encoding, as described herein with reference to FIG. 4A.

For example, as part of concatenating a stream of decoded symbols, the concatenator 440 can apply (state=state*symbol_multiplier+symbol) for the next symbol to be concatenated (where state represents the current stream of concatenated data), or (state=state*codeword_multiplier+codeword), depending on if the concatenator 440 is concatenating codewords or symbols. In the example of concatenating symbols, the concatenator 445 can be configured to access the code-table used by the encoder coders 401A-D, to identify the corresponding symbol_multiplier for the next symbol to be concatenated. The output bit vector 445 can be sent, for example, to a processor.

For entropy encoding schemes in which either codewords or symbols can be of non-integer length, each entropy coder can include a respective multiplication circuit, as described herein with reference to the multiplication circuits 450A-N in FIG. 4A. The multiplier circuit can include one or more circuits configured to multiply the current state of the stream by a corresponding multiplier value, for example either a codeword_multiplier or a symbol_multiplier. In some examples, the multiplier circuit 450 is configured for higher or lower precision multiplication, depending on, for example hardware constraints and trade-offs between circuit design and increasing the precision of fractional values the multiplier circuit can compute.

For example, a more precise multiplier may be more expensive to implement in hardware, but can yield a wider range of products allowing for a higher precision of non-integer lengths for symbols in the code table. On the other hand, a less precise multiplier may be less expensive to implement, but have a correspondingly lower precision of non-integer lengths. Based on the nature of the entropy encoding and the size of the code table, a device can be configured to suit a particular workload, for example to be configured to allow for just the sufficient precision of symbol lengths needed for executing a code table for a given workload.

In some examples, a compressor device can be implemented with a deinterleaver and interleaver similar to the deinterleaver 403 and interleaver 404 described with reference to FIG. 4B. The input bit vector can be from a stream of uncompressed data, and the entropy coders can be configured to compress incoming data. As in FIG. 4B, the entropy coders of a compressor device can request bits, which are translated into bit ranges by a summation circuit for a deinterleaver, and routed to the requesting coder using a crossbar. The entropy coders can generate encoded bits, which are sent to the interleaver that is configured to concatenate the encoded bits to generate an output bit vector of compressed data.

Example Methods

Figure 5:
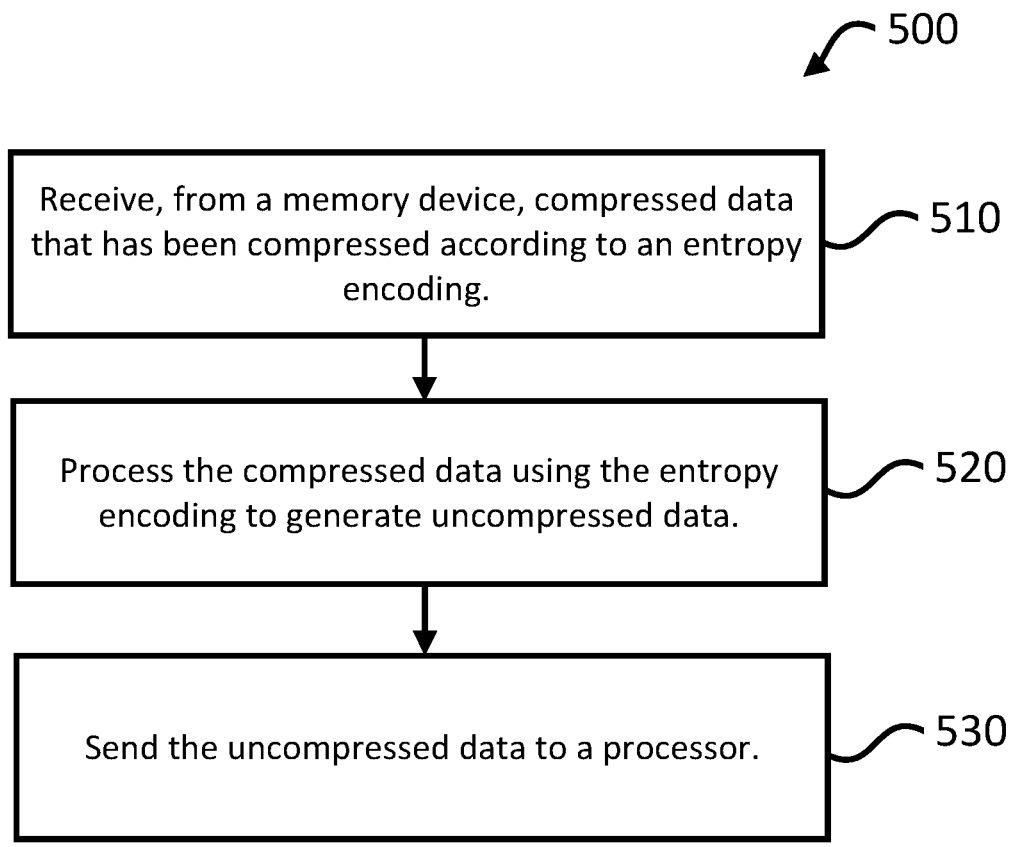
FIG. 5 is a flow diagram of an example process for communicating compressed data between a memory device and a processor, according to aspects of the disclosure.

FIG. 5 is a flow diagram of an example process 500 for communicating compressed data between a memory device and a processor, according to aspects of the disclosure. A decompressor device, such as the decompressor device 120, can perform the process 500.

The decompressor device can receive compressed data that has been compressed using an entropy encoding, according to block 510. As described herein, the received compressed data can be from a memory device of a system implementing the decompressor device. The data received can be compressed outside of the system, for example through a pre-processing engine, or compressed from a compressor device implemented with the decompressor device.

Figure 7:
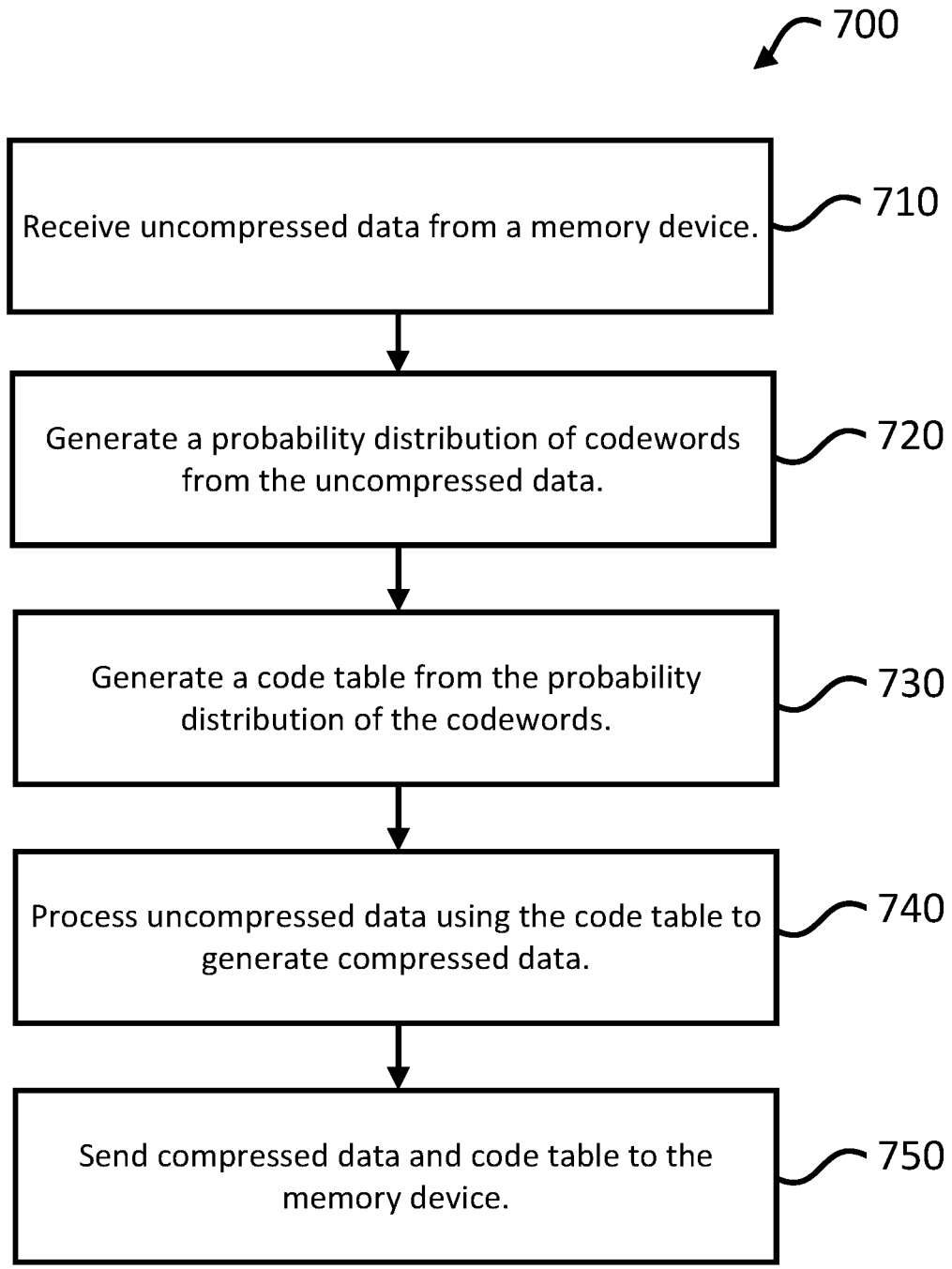
FIG. 7 is a flow diagram of an example process for compressing data using a generated entropy code table, according to aspects of the disclosure.

The decompressor device can process the compressed data using the entropy encoding to generate uncompressed data, according to block 520. As described herein, the decompressor device can be configured for performing an entropy encoding to compress incoming data. As part of performing the encoding, the decompressor device can access an entropy code table stored, for example, in the memory device from which the compressed data was received. FIG. 7, as described herein, shows an example process for generating the code table based on the probability distribution of data in a workload executed by the system.

Figure 6:
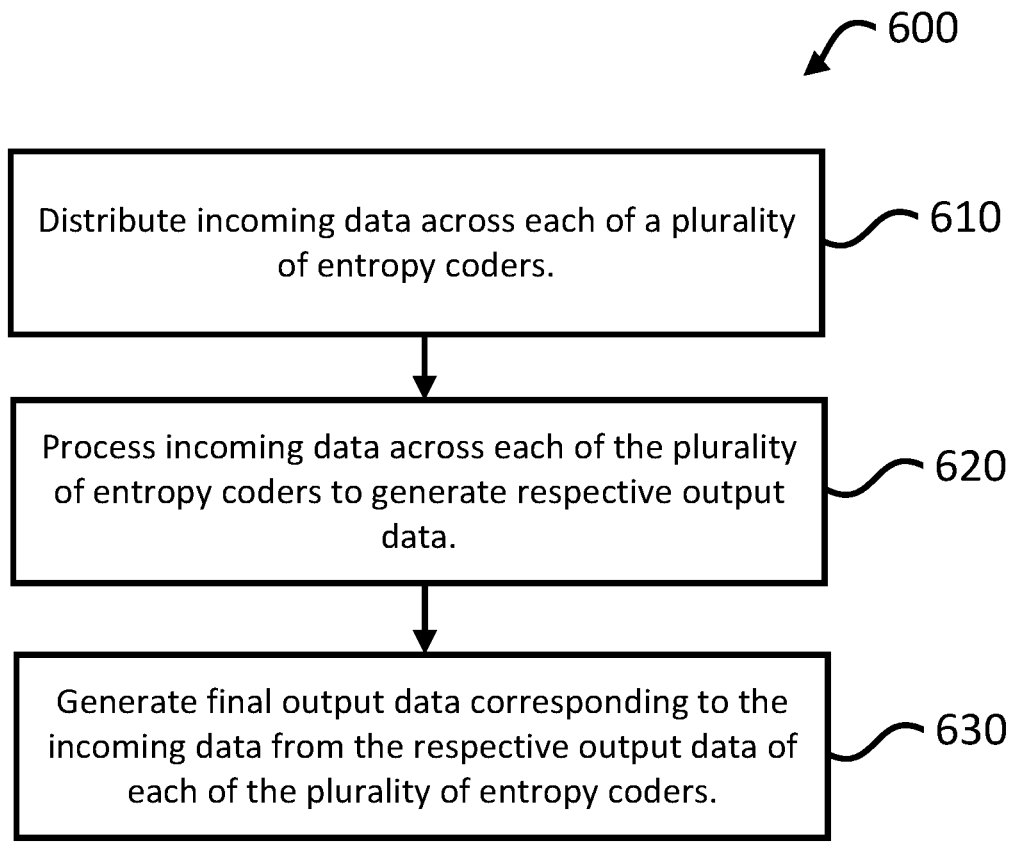
FIG. 6 is a flow diagram of an example process for processing data using multiple entropy coders, according to aspects of the disclosure.

FIG. 6 is a flow diagram of an example process 600 for processing data using multiple entropy coders, according to aspects of the disclosure. A device, for example the device 400 of FIG. 4, configured in accordance with aspects of the disclosure, can perform the process 600.

The device distributes incoming data across each of a plurality of entropy coders, according to block 610. As described herein with reference to FIG. 4, the device can include a deinterleaver configured to distribute the incoming data across each entropy coder implemented in the device.

The device processes incoming input data across each of the plurality of entropy coders to generate respective output data, according to block 620. For example, each entropy coder can be implemented as described herein with reference to FIG. 4, including a respective look-up table or some other structure preloaded with the code table for performing the entropy encoding.

The device generates final output data corresponding to the incoming data from the respective output data of each of the plurality of entropy coders, according to block 630. For example, the device can implement an interleaver as described with reference to FIG. 4 for combining individual outputs from the entropy coders to pass as outgoing data from the device, for example to a processor or a memory device.

FIG. 7 is a flow diagram of an example process 700 for compressing data using a generated entropy code table, according to aspects of the disclosure. For example, a compressor device, such as the compressor device 120 of FIGS. 1-3, can perform the process 700.

The compressor device receives uncompressed data from a memory device, according to block 710. The compressor device generates a probability distribution of codewords from the uncompressed data, according to block 720. The compressor device can implement any of a variety of different techniques for entropy encoding, such as arithmetic codes or ANS. As part of performing the entropy encoding, the compressor device can be configured to determine codewords from the received data, as well as a distribution of their occurrence in the received data. Generally, these codewords can be values of a predetermined fixed length that will be substituted with shorter, symbols of different lengths. As described herein with reference to FIGS. 8-9, the compressor device can leverage the nature of some workloads, such as neural networks, in which many values are repeated across values in the workloads, such as exponents of the different model parameter values. For example and as described herein, the length of the codewords can be the number of bits needed to represent an exponent of a floating-point value, such as a weight value for the neural network.

The compressor device generates a code table from the probability distribution of codewords, according to block 730. Codewords that occur more frequently according to the distribution may be assigned shorter symbols in the code table, while codewords that occur less frequently can be assigned longer symbols in the code table. The exact symbols that are used can vary from implementation-to-implementation, for example depending on the specific technique for entropy encoding implemented by the compressor device.

The compressor device processes uncompressed data using the code table to generate compressed data, according to block 740. The compressor device can be configured to load the generated code table in the look-up table or similar structure for each entropy coder, in implementations in which entropy coders are implemented, for example as described with reference to FIG. 4. In some examples, the compressor device can save the code table to memory in the memory device of the system implementing the compressor device. The compressor device can access the code table as necessary to execute entropy encoding on input data.

The compressor device sends the compressed data and the code table to the memory device, according to block 750. The compressed data is compressed using the entropy encoding and using the code table generated by the compressor device. Additional data received may or may not require generating a new code table, and if not, then the compressor device can process the data as in block 740 without determining the probability distribution or generating a code table, as in blocks 720-730. For some example workloads, the compressor device can be configured to repeat generating a probability distribution and a code table for some portions of data received as part of a workload. For example, the compressor device can be configured to generate a new code table from a new probability distribution for data corresponding to each layer of a neural network layer.

In some implementations, at least some data is compressed by software, for example by a pre-processing engine as described herein with reference to FIG. 3, and stored in the memory device of the system. In those implementations, the pre-processing engine can be configured to receive data as part of a workload for processing by the system, and generate a probability distribution and entropy code table, for example as described herein with respect to blocks 710-730 of FIG. 7. The pre-processing engine can send the code table to the memory device for access by the compressor device, for example to pre-load look-up tables for the entropy coders.

In some implementations, the compressor device or pre-processing engine is configured to generate code tables from a probability distribution of groups of codewords, instead of individual codewords. For example, the device or engine can identify the probability of pairs, triples, quadruples, or other groups of codewords occurring together in the workload.

For example, the device or engine can identify the probability of consecutive exponents of model parameter values occurring having the same value in a workload that is a neural network, generate a probability for that occurrence, and assign a symbol in a code table based on that probability. The resulting code table can be smaller for tuples of codewords processed, versus individual codewords. For example, a code table based on a probability distribution of pairs of codewords occurring in a workload may be half the size of a code table for the same workload based on a distribution of occurrence of individual codewords. The effect can scale for larger tuples, e.g., a code table based on triples of codewords may be ⅓ the size of a code table for a workload based on individual codeword probabilities, and so on.

One reason for generating code tables based on groups of code words can be to meet hardware limitations of the system from implementation-to-implementation, for example to generate a code table that can fit in limited memory available to the compressor and decompressor devices. In this way, the system can be implemented to balance trade-offs between available hardware resources, such as smaller memory requirements for smaller code tables, versus compression performance realized through higher compression ratios for larger code tables. The trade-off can be based at least on design constraints, such as available materials for implementing the system, the cost to manufacture, or other considerations in which the size of available memory to the compressor and decompressor devices for storing the code tables is important.

Figure 8:
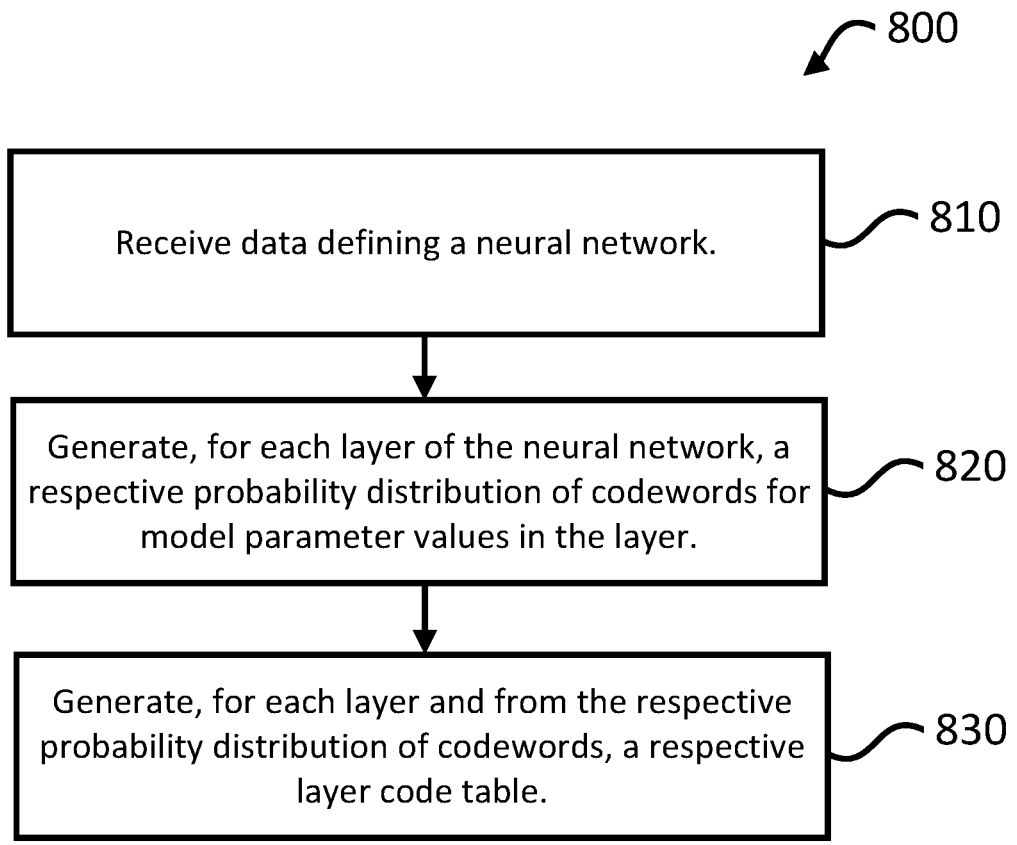
FIG. 8 is a flow diagram of an example process for generating an entropy encoding for neural network data, according to aspects of the disclosure.

FIG. 8 is a flow diagram of an example process 800 for generating an entropy encoding for neural network data, according to aspects of the disclosure. For example, a compressor device, such as the compressor device 120 of FIGS. 1-3, can perform the process 800.

The compressor device receives data defining at least a portion of a neural network, according to block 810. The data can include model parameter values, such as weights and/or bias values. The data may include other information, such as hyperparameter values, including the number of layers of the neural network.

The compressor device generates, for each layer of the neural network, a respective probability distribution of codewords for model parameter values in the layer, according to block 820. The codewords can be some or all of values for different model parameters in the layer. The compressor device can be configured to generate a probability distribution of at least parts of model parameter values. For example, a model parameter value can be a floating-point value represented including a sign, exponent, fraction, or mantissa part. As an example, a 32 bit floating-point value can include 1 bit for representing the sign of the value (positive or negative), 8 bits for representing the exponent of the value, and 23 bits for representing the fraction of the value. TABLE 1, below, shows an example 32-bit floating-point value representing the decimal value 0.15625 as the binary string 00111110001000000000000000000000:

TABLE 1

| Sign (1 bit) | Exponent (8 bits) | Fraction/Mantissa (23 bits) |
|---|---|---|
| 0 | 01111100 | 01000000000000000000000 |

Often, and particularly in dense neural network data, different model parameter values will repeat the same exponent value, but have different fractions or signs. The compressor device can be configured to determine a probability distribution over exponents in model parameter values as codewords. For example, if the exponent 01111100 occurs most often across a workload, the compressor device can generate a code table in which 0111100 is mapped to a short symbol, such as 01. Targeting the exponent of model parameter values can be an effective way to compress dense neural network data, and the effect of the compression is particularly pronounced when applied to large workloads, such as neural networks with millions of parameters.

Figure 9:
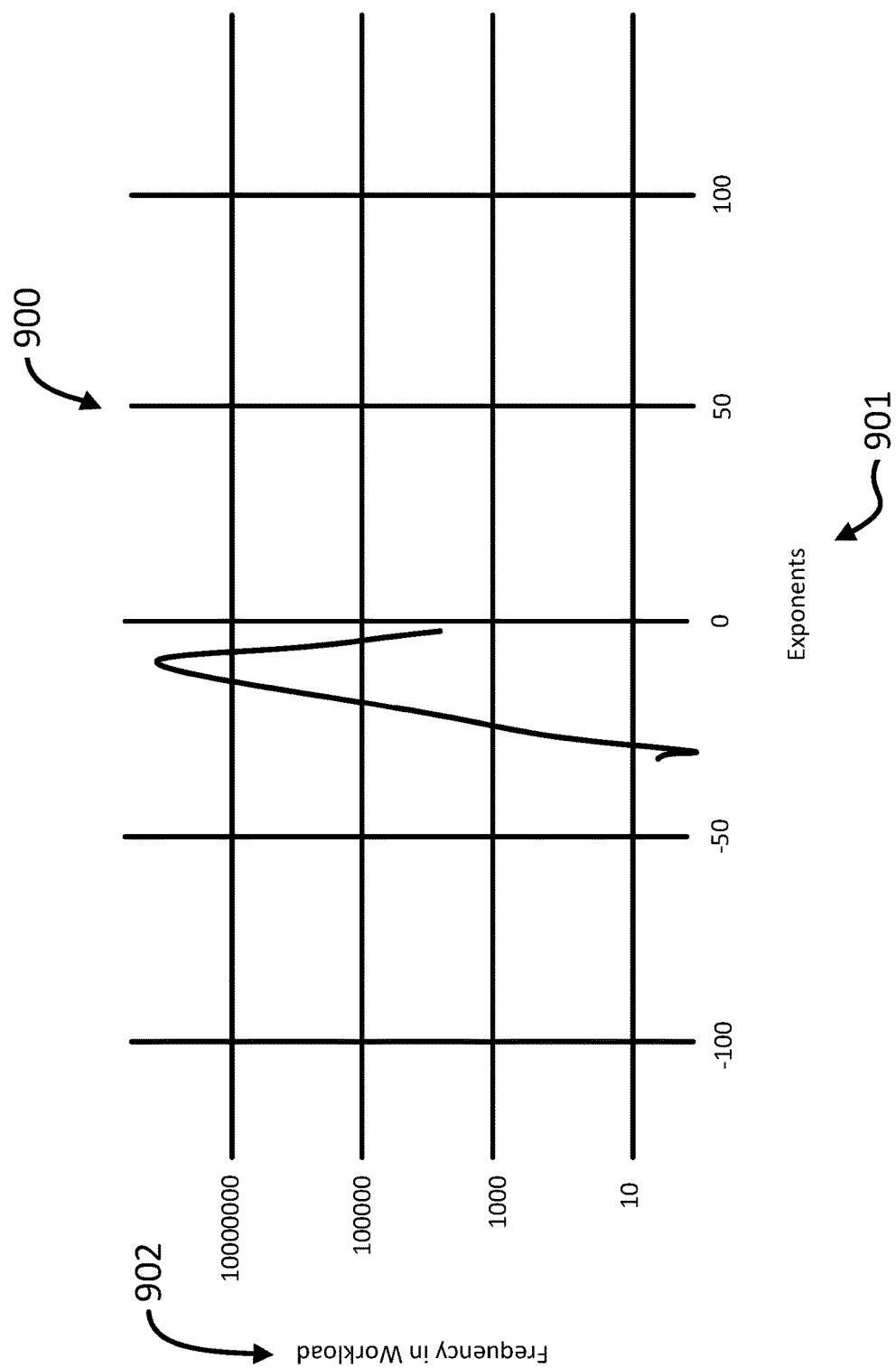
FIG. 9 is a graph representing the frequency of the occurrence of different exponent values in an example workload.

FIG. 9 is a graph 900 representing the frequency of the occurrence of different exponent values in an example workload. X-axis 901 of the graph 900 tracks the value of exponents across model parameter values for a layer of a neural network. Y-axis 902 tracks how often the particular value of an exponent occurs across the model parameter values in the workload. As shown in the graph 900, exponents that are approximately equal to −5 occur much more frequently in this workload than exponents approximately equal to 0 or −50. Therefore, when the compressor device generates a code table for the data represented in the graph 900, the compressor device can map shorter symbols to exponents closer to −5, because those exponents occur most frequently.

Returning to FIG. 8, the compressor device generates, for each layer from the respective probability distribution of codewords for the layer, a respective layer code table. Model parameter values for a given layer can often be even closer to other model parameter values in the same given layer versus values in other layers. One reason for this can be because different layers may correspond to different operations, and therefore in some cases there may not be much similarity between model parameter values for those different layers. By computing a respective layer code table for each layer, the compressor device can account for intra-layer similarities between model parameter values, for example values with a tight distribution of exponents as shown herein with reference to FIG. 9. As a result, per-layer code tables, when applied during compression, can result in higher compression ratios for data of a corresponding layer, versus applying a code table generated from a distribution of codewords across the entire network.

In some implementations, the process 800 can be performed by a pre-processing engine, such as the pre-processing engine 301 of FIG. 3. The pre-processing engine 301 can receive the data defining the neural network, and generate per-layer code tables as described herein with reference to blocks 810-830 of FIG. 8. In some implementations, the pre-processing engine can generate a code table over the entire neural network and/or for parts of model parameter values for the entire neural network, such as exponents.

The pre-processing engine can also generate per-layer code tables, for example as described with reference to FIGS. 8-9, and determine whether the per-layer code tables result in an average compression ratio that is better than the code table for the entire neural network, within some predetermined threshold. Depending on which code table results in the better compression ratio, the pre-processing can send the code table or tables to the memory device for the system.

In some implementations, the pre-processing engine can assign a combination of per-layer code tables for at least some of the layers of a network (a "network code table"), and assign a code table generated from a distribution of codewords over the entire neural network for other layers of the network. For example, the pre-processing engine can determine, for each layer, whether the layer exceeds a predetermined size threshold. The size threshold can be based on, for example, a maximum number of model parameter values in the layer, a maximum amount of data used to represent the layer in memory, and/or any other metric for comparing size of neural network layers.

The value of the size threshold can be determined, for example, based on the cost of generating a per-layer table for a layer below the threshold outweighing the performance increase in compression using the per-layer table. If any performance gain, e.g., throughput or memory utilization, gained by a higher compression ratio of a per-layer table versus a compression ratio of a network table for the layer is wiped out by the resources used to generate the per-layer table, then the pre-processing engine can use the network code table for compressing the layer, instead.

If the pre-processing engine determines that a layer exceeds the size threshold, then the pre-processing engine can generate a per-layer code table for the layer, generated for example as described herein. Otherwise, if the layer does not meet or exceed the size threshold, the pre-processing engine can assign a network code table, generated using a distribution of codewords over the entire network.

Figure 10:
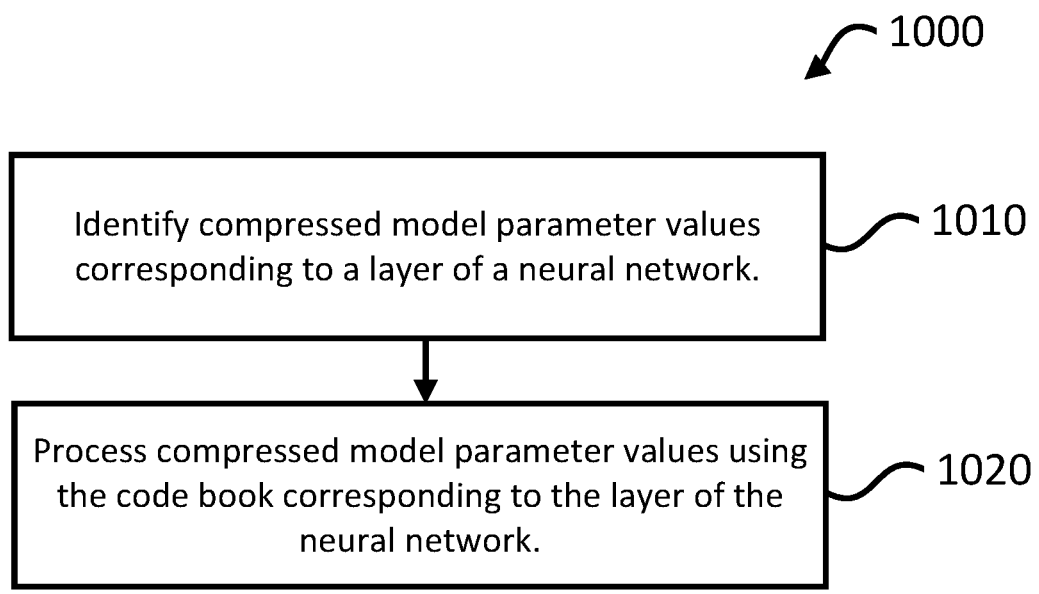
FIG. 10 is a flow diagram of an example process for identifying and processing compressed model parameter values of a neural network, according to aspects of the disclosure.

FIG. 10 is a flow diagram of an example process 1000 for identifying and processing compressed model parameter values of a neural network, according to aspects of the disclosure. For example, a decompressor device, such as the decompressor device 120 of FIGS. 1-3, can perform the process 1000.

The decompressor device identifies compressed model parameter values corresponding to a layer of a neural network, according to block 1010. For example, the compressed data stored in a memory device coupled to the decompressor device can include compressed model parameter values. The decompressor device can also receive data, for example by the memory device, indicating which layer the compressed model parameter values are from.

The decompressor device processes the compressed model parameter values using the code book corresponding to the layer of the neural network, according to block 1020. The code book can be generated by a compressor device and/or by a pre-processing engine, as described herein. In examples in which multiple code books are generated and stored in the memory device, the decompressor device can load the code book corresponding to the layer corresponding to the compressed model parameter values. In implementations in which the decompressor device is implemented with multiple entropy coders—for example as described with reference to FIG. 4—the decompressor device can load the layer code table into the respective look-up table for each entropy coder.

Example Computing Environment

Figure 11:
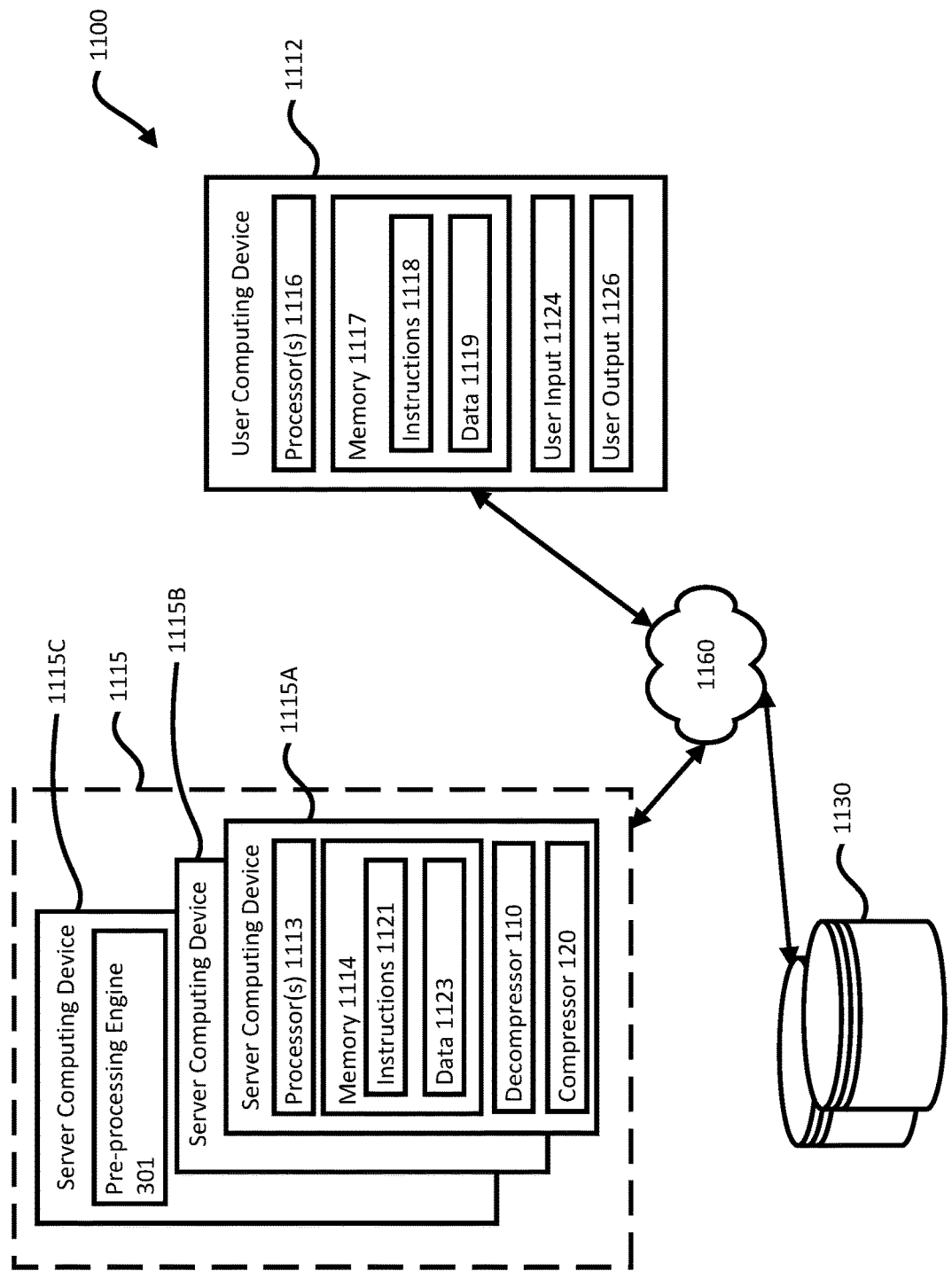
FIG. 11 is a block diagram of an example computing environment implementing the compressor device and decompressor device, according to aspects of the disclosure.

FIG. 11 is a block diagram of an example environment 1100 for implementing the compression/decompression system 100 and the pre-processing engine 301, including the decompressor device 120 and the compressor device 120. The system 100 and the pre-processing engine 301 can be implemented on one or more devices having one or more processors in one or more locations, such as in server computing devices 1115, including server computing devices 1115A-C. Although the pre-processing engine 301 and the system 100 are shown as implemented on separate server computing devices, in some implementations the pre-processing engine 301 and the system 100 can be implemented on the same device.

User computing device 1112 and the server computing device 1115 can be communicatively coupled to one or more storage devices 1130 over a network 1160. The storage device(s) 1130 can be a combination of volatile and non-volatile memory, and can be at the same or different physical locations than the computing devices 1112, 1115. For example, the storage device(s) 1130 can include any type of non-transitory computer readable medium capable of storing information, such as a hard-drive, solid state drive, tape drive, optical storage, memory card, ROM, RAM, DVD, CD-ROM, write-capable, and read-only memories.

The server computing device 1115A can include one or more processors 1113 and memory 1114. The memory 1114 can store information accessible by the processor(s) 1113, including instructions 1121 that can be executed by the processor(s) 1113. The memory 1114 can also include data 1123 that can be retrieved, manipulated or stored by the processor(s) 1113. The memory 1114 can be a type of non-transitory computer readable medium capable of storing information accessible by the processor(s) 1113, such as volatile and non-volatile memory. The processor(s) 1113 can include one or more central processing units (CPUs), graphic processing units (GPUs), field-programmable gate arrays (FGPAs), and/or application-specific integrated circuits (ASICs), such as tensor processing units (TPUs).

The instructions 1121 can include one or more instructions that when executed by the processor(s) 1113, causes the one or more processors to perform actions defined by the instructions. The instructions 1121 can be stored in object code format for direct processing by the processor(s) 1113, or in other formats including interpretable scripts or collections of independent source code modules that are interpreted on demand or compiled in advance. The instructions 1121 can include instructions for implementing the pre-processing engine 301 consistent with aspects of this disclosure. The pre-processing engine 301 can be executed using the processor(s) 1113, and/or using other processors remotely located from the server computing device 1115.

The data 1123 can be retrieved, stored, or modified by the processor(s) 1113 in accordance with the instructions 1121. The data 1123 can be stored in computer registers, in a relational or non-relational database as a table having a plurality of different fields and records, or as JSON, YAML, proto, or XML documents. The data 1123 can also be formatted in a computer-readable format such as, but not limited to, binary values, ASCII or Unicode. Moreover, the data 1123 can include information sufficient to identify relevant information, such as numbers, descriptive text, proprietary codes, pointers, references to data stored in other memories, including other network locations, or information that is used by a function to calculate relevant data.

The user computing device 1112 can also be configured similar to the server computing device 1115, with one or more processors 1116, memory 1117, instructions 1118, and data 1119. The user computing device 1112 can also include a user output 1126, and a user input 1124. The user input 1124 can include any appropriate mechanism or technique for receiving input from a user, such as keyboard, mouse, mechanical actuators, soft actuators, touchscreens, microphones, and sensors.

The server computing devices 1115 can be configured to transmit data to the user computing device 1112, and the user computing device 1112 can be configured to display at least a portion of the received data on a display implemented as part of the user output 1126. The user output 1126 can also be used for displaying an interface between the user computing device 1112 and the server computing devices 1115. The user output 1126 can alternatively or additionally include one or more speakers, transducers or other audio outputs, a haptic interface or other tactile feedback that provides non-visual and non-audible information to the platform user of the user computing device 1112.

Although FIG. 11 illustrates the processors 1113, 1116 and the memories 1114, 1117 as being within the computing devices 1115, 1112, components described in this specification, including the processors 1113, 1116 and the memories 1114, 1117 can include multiple processors and memories that can operate in different physical locations and not within the same computing device. For example, some of the instructions 1121, 1118 and the data 1123, 1119 can be stored on a removable SD card and others within a read-only computer chip. Some or all of the instructions and data can be stored in a location physically remote from, yet still accessible by, the processors 1113, 1116. Similarly, the processors 1113, 1116 can include a collection of processors that can perform concurrent and/or sequential operation. The computing devices 1115, 1112 can each include one or more internal clocks providing timing information, which can be used for time measurement for operations and programs run by the computing devices 1115, 1112.

The server computing devices 1115 can be configured to receive requests to process data from the user computing device 1112. For example, the environment 1100 can be part of a computing platform configured to provide a variety of services to users, through various user interfaces and/or APIs exposing the platform services. One or more services can be a machine learning framework or a set of tools for generating neural networks or other machine learning models according to a specified task and training data. The user computing device 1112 may receive and transmit data specifying target computing resources to be allocated for executing a neural network trained to perform a particular neural network task.

The devices 1112, 1115 can be capable of direct and indirect communication over the network 1160. The devices 1115, 1112 can set up listening sockets that may accept an initiating connection for sending and receiving information. The network 1160 itself can include various configurations and protocols including the Internet, World Wide Web, intranets, virtual private networks, wide area networks, local networks, and private networks using communication protocols proprietary to one or more companies. The network 1160 can support a variety of short- and long-range connections. The short- and long-range connections may be made over different bandwidths, such as 2.402 GHz to 2.480 GHz (commonly associated with the Bluetooth® standard), 2.4 GHz and 5 GHz (commonly associated with the Wi-Fi® communication protocol); or with a variety of communication standards, such as the LTE® standard for wireless broadband communication. The network 1160, in addition or alternatively, can also support wired connections between the devices 1112, 1115, and the datacenter 1150, including over various types of Ethernet connection.

Although server computing devices 1115A-C and user computing device 1112 are shown in FIG. 11, it should be understood that the aspects of the disclosure can be implemented according to a variety of different configurations and quantities of computing devices, including in paradigms for sequential or parallel processing, or over a distributed network of multiple devices. In some implementations, aspects of the disclosure can be performed on a single device, and any combination thereof.

Aspects of this disclosure can be implemented in digital circuits, computer-readable storage media, as one or more computer programs, or a combination of one or more of the foregoing. The computer-readable storage media can be non-transitory, e.g., as one or more instructions executable by a cloud computing platform and stored on a tangible storage device.

In this specification the phrase "configured to" is used in different contexts related to computer systems, hardware, or part of a computer program, engine, or module. When a system is said to be configured to perform one or more operations, this means that the system has appropriate software, firmware, and/or hardware installed on the system that, when in operation, causes the system to perform the one or more operations. When some hardware is said to be configured to perform one or more operations, this means that the hardware includes one or more circuits that, when in operation, receive input and generate output according to the input and corresponding to the one or more operations. When a computer program, engine, or module is said to be configured to perform one or more operations, this means that the computer program includes one or more program instructions, that when executed by one or more computers, causes the one or more computers to perform the one or more operations.

While operations shown in the drawings and recited in the claims are shown in a particular order, it is understood that the operations can be performed in different orders than shown, and that some operations can be omitted, performed more than once, and/or be performed in parallel and/or simultaneously with other operations. Further, the separation of different system components configured for performing different operations should not be understood as requiring the components to be separated. The components, modules, programs, and engines described can be integrated together as a single system, or be part of multiple systems.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible implementations. Further, the same reference numbers in different drawings can identify the same or similar elements.

The invention claimed is:

1. A system, comprising:
one or more memory devices including a first memory device;
one or more processors including a first processor, wherein the one or more processors are coupled to the one or more memory devices; and
a decompressor device coupled at least to the first memory device and the first processor, wherein the decompressor device is configured to:
receive, from the first memory device, compressed data that has been compressed using an entropy encoding,
process the compressed data using the entropy encoding to generate uncompressed data, and
send the uncompressed data to the first processor,
wherein the compressed data is data compressed from input data, and
wherein the one or more processors are configured to:
process input data to generate a probability distribution of codewords from the input data;
generate a code table from the probability distribution of the codewords in the input data;

store the code table in the first memory device; and
wherein the decompressor device is configured to process the compressed data by accessing the code table stored in the first memory device.

2. The system of claim 1,
wherein the compressed data is first compressed data and the uncompressed data is first uncompressed data, and
wherein the system further comprises a compressor device coupled at least to the first memory device and the first processor, wherein the compressor device is configured to:
receive second uncompressed data from the first processor;
process the second uncompressed data using the entropy encoding to generate second compressed data; and
send the second compressed data to the first memory device.

3. The system of claim 2, wherein at least one of the compressor device and the decompressor device is implemented as one or more integrated circuits coupled to the first memory device and the first processor by one or more circuit interconnects.

4. The system of claim 2,
wherein a code table corresponding to the entropy encoding is stored on the first memory device, and
wherein at least one of the decompressor device and the compressor device is configured to process data using the entropy encoding by accessing the code table from the first memory device.

5. The system of claim 2, wherein the compressor device is further configured to:
receive third uncompressed data from the first memory device;
generate, from the third uncompressed data, the probability distribution of codewords from the third uncompressed data;
process the third uncompressed data using the generated code table to generate third compressed data; and
send the third compressed data and the generated code table to the first memory device.

6. The system of claim 5, wherein the decompressor device is further configured to:
receive, from the first memory device, the generated code table; and
process the third compressed data using the entropy encoding and the code table.

7. The system of claim 1,
wherein the input data comprises a plurality of model parameter values for a neural network comprising a plurality of layers;
wherein the one or more processors are further configured to:
generate, for each layer of the neural network, a respective probability distribution of codewords for respective model parameter values in the layer, and
generate, for each layer of the neural network and from the respective probability distribution for the layer, a respective layer code table; and
wherein the code table stored in the first memory device comprises a plurality of layer code tables.

8. The system of claim 7, wherein the decompressor device is further configured to:
identify first compressed model parameter values corresponding to a first layer of the plurality of layers, and
process the first compressed model parameter values using the entropy encoding and a first layer code table corresponding to the first layer.

9. The system of claim 7,
wherein the plurality of model parameter values are each represented in a floating point format comprising at least an exponent, and
wherein the one or more processors are further configured to:
generate, for each layer of the neural network, the respective probability distribution of codewords using exponents of model parameter values in the layer as codewords.

10. The system of claim 1,
wherein the decompressor device comprises a plurality of entropy coders configured to decompress data using the entropy encoding, and
wherein in processing the data using the entropy coding, the decompressor device is configured to:
distribute the compressed data across each of the plurality of entropy coders;
process the compressed data across each of the plurality of entropy coders to generate respective output decompressed data; and
generate the decompressed data corresponding to the compressed data from the respective output decompressed data of each of the plurality of entropy coders.

11. The system of claim 10, wherein the number of entropy coders that the decompressor device comprises depends at least on (i) the maximum bandwidth between the first memory device and the first processor, and (ii) the maximum bandwidth of each entropy coder.

12. A decompressor device for data decompression, wherein the decompression device is configured to:
receive, from a first memory device, compressed data, wherein the compressed data has been compressed using an entropy encoding;
process the compressed data using the entropy encoding to generate uncompressed data by using a code table generated from a probability distribution of codewords identified in uncompressed input data; and
send the uncompressed data to a first processor.

13. The decompressor device of claim 12, wherein the decompressor device is an integrated circuit coupled to the first memory device and the first processor by one or more circuit interconnects.

14. The decompressor device of claim 12, wherein the code table comprises a plurality of layer code tables, each layer code table corresponding to codewords from a plurality of model parameter values of a respective layer of a neural network comprising a plurality of layers.

15. The decompressor device of claim 14,
wherein the plurality of model parameter values are each represented in a floating point format comprising at least an exponent; and
wherein the codewords from the plurality of model parameter values of the respective layer are exponents of plurality of the model parameter values.

16. A method for data decompression performed by a decompressor device, the method comprising:
receiving, by the decompressor device and from a first memory device, compressed data, wherein the compressed data has been compressed using an entropy encoding;
processing, by the decompressor device, the compressed data using the entropy encoding to generate uncompressed data by using a code table generated from a probability distribution of codewords identified in uncompressed input data; and sending, by the decompressor device, the uncompressed data to a first processor.

17. The method of claim 16, wherein the decompressor device is one or more integrated circuits coupled to the first memory device and the first processor by one or more circuit interconnects.

18. The method of claim 16,
wherein the code table corresponding to the entropy encoding is stored on the first memory device, and
wherein processing the compressed data comprises using the code table from the first memory device.

* * * * *